United States Patent [19]
Wurzburg

[11] Patent Number: 4,511,851
[45] Date of Patent: Apr. 16, 1985

[54] METHOD AND APPARATUS FOR OBTAINING SMALL FRACTIONAL UNITS OF CAPACITANCE

[75] Inventor: Henry Wurzburg, Round Rock, Tex.

[73] Assignee: Motorola, Inc., Schaumburg, Ill.

[21] Appl. No.: 449,357

[22] Filed: Dec. 13, 1982

[51] Int. Cl.³ .............................................. H03F 1/34
[52] U.S. Cl. ...................................... 330/51; 330/107; 307/520; 333/173; 328/167
[58] Field of Search ................... 330/51, 107; 307/520; 333/173; 328/127, 167

[56] References Cited
U.S. PATENT DOCUMENTS 4,087,737  5/1978  De Gennaro .................. 330/107 X Primary Examiner—James B. Mullins
Attorney, Agent, or Firm—Anthony J. Sarli, Jr.; Jeffrey Van Myers; Robert L. King

[57] ABSTRACT

A method and apparatus for obtaining small fractional units of capacitance in amplifier circuits using units of capacitance which may be accurately ratioed is provided. Several embodiments are disclosed in which an input voltage is sampled onto two input capacitances with an opposite charge polarity. The two input capacitances are assigned capacitive values so that the second capacitive value is a fractional percentage of the first capacitive value. However, the effective total input capacitance is made to appear to be equal to the differential capacitive value which may be made a small fractional unit of capacitance.

10 Claims, 4 Drawing Figures

4,511,851

METHOD AND APPARATUS FOR OBTAINING SMALL FRACTIONAL UNITS OF CAPACITANCE

TECHNICAL FIELD

This invention relates generally to capacitive electrical circuits and, more particularly, to switched capacitor circuits.

BACKGROUND ART

The advantages of using switched capacitors in filter circuits and other electronic circuits are well known in the art. One primary advantage of switched capacitor circuits is the fact that capacitor ratios can be accurately matched. Occasionally, capacitor ratios in excess of one hundred to one are desired. In such a case, one hundred and one units of capacitance are typically fabricated to implement the ratio. A resulting problem with this implementation is that considerable die area is consumed by the fabrication of so many units of capacitance. The use of fractional units of capacitance may greatly reduce die area. However, fractional units of capacitance of less than 0.5 unit are typically not feasibly implementable because the area to perimeter ratio of a fractional unit of capacitance is drastically different from the area to perimeter ratio of a single unit of capacitance. As a result, large variations in the capacitance ratio are created by the differing etch rates during fabrication.

SUMMARY OF THE INVENTION

Accordingly, it is an object of the present invention to provide an improved method for obtaining fractional units of capacitance.

Another object of the invention is to provide an improved switched capacitor circuit obtaining large capacitor ratios with fractional units of capacitance.

A further object of the invention is to provide an improved circuit having precise capacitor ratios.

Yet another object of the invention is to provide an improved switched capacitor filter.

In carrying out the above and other objects of the present invention, there is provided, in one form, a method for obtaining small fractional units of capacitance in an amplifier circuit by sampling an input voltage onto first capacitance means with a predetermined polarity. The input voltage is also sampled onto second capacitance means with an opposite polarity. The capacitive value of the second capacitance means is fabricated to be a fractional percentage of the capacitive value of the first capacitance means. The resulting opposite polarity charges existing on the first and second capacitance means are coupled to amplifier means which provide an output voltage of precise voltage gain.

The above and other objects, features and advantages of the present invention will be more clearly understood from the following detailed description taken in conjunction with the accompanying drawings.

DESCRIPTION OF THE PREFERRED EMBODIMENT

Figure 1:
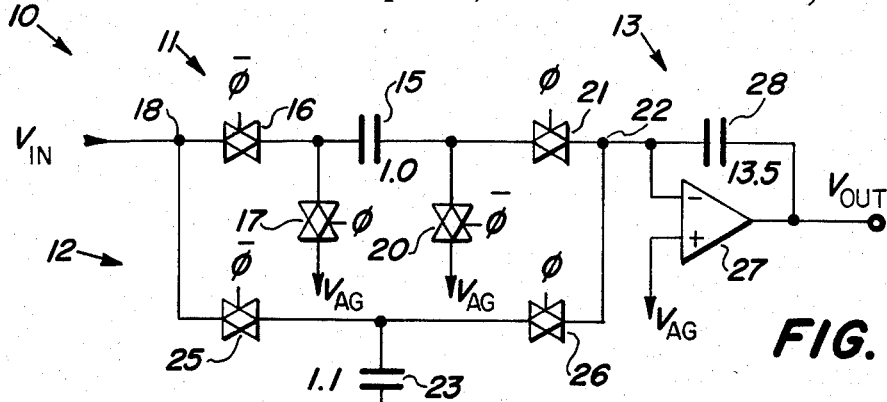
FIG. 1 illustrates in schematic form an amplifier circuit utilizing the method of this invention in accordance with a preferred embodiment.

Shown in FIG. 1 is an amplifier circuit 10 which functions as a switched capacitor filter. Amplifier circuit 10 generally comprises first switched capacitance means 11, second switched capacitance means 12 and amplifier means 13. Switched capacitance means 11 comprise a capacitor 15 having a first electrode coupled to first terminals of switches 16 and 17. A second terminal of switch 16 is coupled to an input terminal 18 for receiving an input voltage $V_{IN}$, and a second terminal of switch 17 is coupled to a reference voltage potential called analog ground, $V_{AG}$. A second electrode of capacitor 15 is coupled to first terminals of switches 20 and 21. A second terminal of switch 20 is coupled to reference voltage potential $V_{AG}$, and a second terminal of switch 21 is coupled to a summing node 22.

Switched capacitance means 12 comprise a capacitor 23 having a first electrode coupled to reference voltage potential $V_{AG}$, and a second electrode coupled to first terminals of switches 25 and 26. Switch 25 has a second terminal coupled to input terminal 18, and switch 26 has a second terminal coupled to summing node 22.

Figure 4:
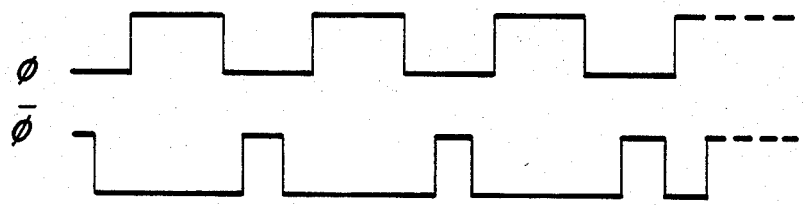
FIG. 4 illustrates in graphic form control signals associated with the circuits of FIGS. 1, 2 and 3.

In a preferred form, switches 16, 17, 20, 21, 25 and 26 are MOS transmission gates which are clocked in a conventional manner. Switches 17, 21 and 26 are made conductive by control signal $\phi$ of FIG. 4 and switches 16, 20 and 25 are made conductive by control signal $\overline{\phi}$. As illustrated in FIG. 4, control signals $\phi$ and $\overline{\phi}$ are nonoverlapping, complementary signals of predetermined frequency.

Amplifier means 13 comprise an operational amplifier 27 having an inverting input coupled to summing node 22 and a noninverting input coupled to analog ground, $V_{AG}$. A feedback capacitor 28 has a first electrode coupled to summing node 22 and a second electrode coupled to an output of operational amplifier 27 for providing an output voltage $V_{OUT}$.

In operation, an analog input voltage $V_{IN}$ is coupled to input terminal 18 where $V_{IN}$ is coupled to the first electrode of capacitor 15 and the second electrode of capacitor 23 during the presence of control signal $\overline{\phi}$ in a high logic state while the second electrode of capacitor 15 and the first electrode of capacitor 23 are coupled to reference voltage $V_{AG}$. In this manner, the first electrode of capacitor 15 is charged positively with respect to the second electrode thereof, and the first electrode of capacitor 23 is charged negatively with respect to the second electrode of capacitor 23. When control signal $\overline{\phi}$ transitions to a low logic state and control signal $\phi$ transitions to a high logic state, the charge on capacitors 15 and 23 is coupled to amplifier means 13 and is stored onto feedback capacitor 28. It can readily be shown that the resulting output voltage is:

$$\Delta V_{OUT} = [(C_{15}/C_{28}) - (C_{23}/C_{28})] V_{IN}$$

where $C_{15}$, $C_{23}$ and $C_{28}$ are abbreviations for the capacitance of capacitors 15, 23 and 28, respectively. In effect, capacitor 15 has sampled $V_{IN}$ in a positive manner and capacitor 23 has sampled $V_{IN}$ in a negative manner.

Utilizing the fact that $V_{OUT}$ is dependent upon the difference in capacitance between capacitors 15 and 28, a method for obtaining small effective fractional units of capacitance for capacitors 15 and 28 may be realized.

Although it is not practical to make capacitive units of 0.1, fractional units of 1.1, for example, may be realized and accurately matched with other capacitors. Therefore, if a voltage attenuation of 135, for example, is designed for the circuit of FIG. 1, capacitor 15 may be assigned a value of 1 unit and capacitor 23 a value of 1.1 units and capacitor 28 a value of 13.5 units. By utilizing the differential charging of capacitors 15 and 23, an effective capacitive value of 0.1 unit is realized even though capacitors having much larger unit values have been utilized. However, only 15.6 units of capacitance have been used to obtain a voltage attenuation of 135. If capacitor 15 is made larger than capacitor 23, $\Delta V_{OUT}$ is positive. If capacitor 23 is made larger than capacitor 15, $\Delta V_{OUT}$ is negative.

Figure 2:
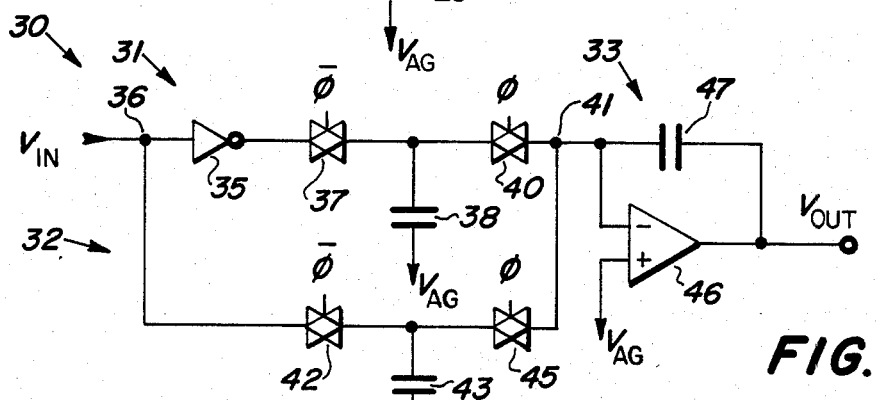
FIG. 2 illustrates in schematic form another amplifier circuit utilizing the method of this invention.

Shown in FIG. 2 is another embodiment of the invention utilizing a different structure. An amplifier 30 comprises first switched capacitance portion 31, second switched capacitance portion 32 and amplifier means 33. First switched capacitance portion 31 comprises an inverting amplifier 35 having an input coupled to an input terminal 36 for receiving an analog input voltage $V_{IN}$, and an output coupled to a first terminal of switch 37. A second terminal of switch 37 is coupled to both a first electrode of a capacitor 38 and a first terminal of a switch 40. A second electrode of capacitor 38 is coupled to reference voltage $V_{AG}$, and a second terminal of switch 40 is coupled to a summing node 41.

Second switching capacitance portion 32 comprises a switch 42 having a first terminal coupled to input terminal 36 and a second terminal coupled to both a first electrode of a capacitor 43 and a first terminal of a switch 45. A second electrode of capacitor 43 is coupled to reference voltage $V_{AG}$ and a second terminal of switch 45 is coupled to summing node 41.

Amplifier means 33 comprise an operational amplifier 46 having an inverting input coupled to summing node 41 and a noninverting input coupled to reference voltage $V_{AG}$. A feedback capacitor 47 has a first electrode coupled to summing node 41 and a second electrode coupled to an ouput of operational amplifier 46, for providing an output voltage $V_{OUT}$.

Switches 40 and 45 are made conductive by the presence of control signal $\emptyset$ in a high logic state, and switches 37 and 42 are made conductive by the presence of control signal $\emptyset$ in a high logic state. In a preferred form, switches 37, 40, 42 and 45 are MOS transmission gates clocked in a conventional manner.

In operation, the circuit of FIG. 2 is functionally equivalent to the circuit of FIG. 1. By utilizing an inverting amplifier having a unity gain, such as amplifier 35, similar switching structures may be utilized for both capacitance portions 31 and 32 to provide both positive and negative output terms. Similarly, capacitors 38 and 43 are selected so that the differential value of the capacitors is the total effective input capacitance of amplifier means 33. The differential value may be chosen so that a small fractional unit of capacitance results from easily implementable capacitive units. Although the circuits of FIGS. 1 and 2 are subject to charging errors resulting from parasitic capacitance, both circuits may be made parasitic insensitive. The first switched capacitance means 11 of FIG. 1 is parasitic capacitance insensitive. If the structure used in both the first and second switched capacitance means of FIGS. 1 and 2 are implemented with the structure of switched capacitance means 11, a parasitic capacitance insensitive structure exists. This however requires four switching means per capacitor as illustrated for switching means 11.

Figure 3:
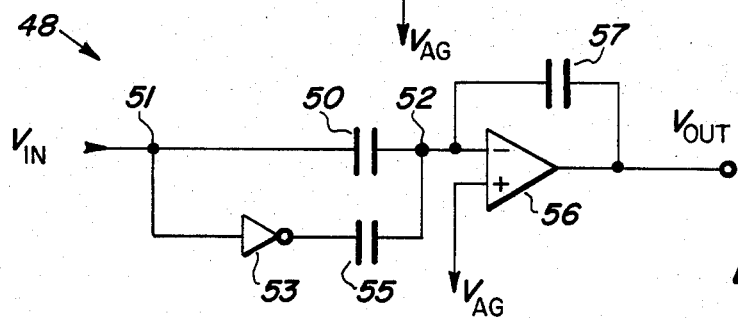
FIG. 3 illustrates in schematic form yet another amplifier circuit utilizing the method of this invention.

Shown in FIG. 3 is yet another embodiment of the method of the invention for digital input signal applications and direct capacitive input terms. A digital amplifier circuit 48 comprises a capacitor 50 having a first electrode coupled to an input terminal 51 and a second electrode coupled to a summing node 52. An inverter 53 has an input coupled to input terminal 51 and an output coupled to a first electrode of a capacitor 55. A second electrode of capacitor 55 is coupled to summing node 52. An operational amplifier 56 has an inverting input coupled to summing node 52 and a noninverting input coupled to reference voltage $V_{AG}$. A feedback capacitor 57 has a first electrode coupled to summing node 52 and a second electrode coupled to an output of operational amplifier amplifier 56, for providing an output voltage $V_{OUT}$.

In operation, a digital input voltage may be directly coupled into circuit 48. A precise gain output is provided which is determined, in part, by the capacitive value of capacitor 57 and the differential capacitive value of capacitors 50 and 55 which may easily be made a small fractional unit of capacitance.

By now it should be appreciated that a method for obtaining small fractional units of capacitance in both analog and digital amplifier circuits has been provided. A minimization of circuit die area is achieved without minimizing precise capacitor ratioing.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. An amplifier circuit utilizing small fractional capacitance units, comprising:

operational amplifier means having an inverting input, a noninverting input and an output, for developing an output voltage;

capacitive feedback means coupled between the output and the inverting input of the operational amplifier means, and having a first predetermined capacitive value;

first switched capacitance means having an input coupled to an input terminal, and an output coupled to the inverting input of said operational amplifier means, said first switched capacitance means having a second predetermined capacitive value; and second switched capacitance means having an input coupled to the input terminal, and an output coupled to the inverting input of said operational amplifier means, said second capacitance means having a third predetermined capacitive value which is a fractional percentage of said second predetermined capacitive value, wherein said output voltage is proportional to the ratio of the second and third capacitive differential value to the first capacitive value.

2. The amplifier circuit of claim 1 wherein said first switched capacitance means comprises;

first switching means responsive to a first control signal and having a first terminal coupled to the input terminal, and a second terminal;

second switching means responsive to a second control signal and having a first terminal coupled to a reference voltage potential terminal, and a second terminal;

a first capacitor having a first electrode coupled to the second terminals of said first and second switching means, and a second electrode;

third switching means responsive to said first control signal and having a first terminal coupled to the reference voltage potential, and a second terminal coupled to the second electrode of said first capacitor; and fourth switching means responsive to said second control signal and having a first terminal coupled to the second electrode of said first capacitor, and a second terminal coupled to the noninverting input of said operational amplifier means.

3. The amplifier circuit of claim 2 wherein said first and second control signals are nonoverlapping complementary signals.

4. The amplifier circuit of claim 2 wherein said second switched capacitance means comprise:

first switching means responsive to a first clock signal having a first terminal coupled to the input terminal, and a second terminal;

a second capacitor having a first electrode coupled to a reference voltage terminal, and a second electrode; and second switching means responsive to a second clock signal having a first terminal coupled to both the second terminal of said first switching means and the second electrode of said second capacitor, and a second terminal coupled to the inverting input of said operational amplifier means.

5. The amplifier circuit of claim 4 wherein said first and second clock signals are nonoverlapping complementary signals.

6. The amplifier circuit of claim 1 wherein said first switched capacitance means comprise:

first switching means responsive to a first control signal and having a first terminal coupled to the input terminal, and a second terminal;

a first capacitor having a first electrode coupled to a reference voltage terminal, and a second electrode; and second switching means responsive to a second control signal and having a first terminal coupled to both the second terminal of said first switching means and to the second electrode of said first capacitor, and a second terminal coupled to the inverting input of said operational amplifier means.

7. The amplifier circuit of claim 6 wherein said first and second signals are nonoverlapping complementary signals.

8. The amplifier circuit of claim 6 further comprising:

an inverting amplifier having a voltage gain of one and having an input coupled to the input terminal and an output coupled to the first terminal of said first switching means.

9. A method for obtaining small units of capacitance, for use in an amplifier comprising the steps of:

selecting an input capacitance comprising a first capacitor having a first predetermined capacitance and a second capacitor having a second predetermined capacitance which is a fractional value of the first capacitance;

coupling a digital input voltage to said first capacitor in a predetermined polarity to provide a first charge;

coupling said digital input voltage to said second capacitor in an opposite polarity to provide a second charge; and summing said first and second charges at an input of the amplifier having a feedback capacitor to provide an output voltage having a precise gain, wherein the effective input capacitance is equal to the difference in capacitance between said first and second capacitors.

10. The method of claim 9 further including determining voltage gain of the amplifier by the following equation:

*Voltage Gain* $= (C1 - C2)/(C3)$, wherein C1 is the capacitance of the first capacitor, C2 is the capacitance of the second capacitor, and C3 is the capacitance of the feedback capacitor.

* * * * *